United States Patent [19]
Hoover

[11] 4,457,011
[45] Jun. 26, 1984

[54] FM BROADCAST BAND DEMODULATOR/STEREO DECODER

[76] Inventor: Brian L. Hoover, 1153 Alpine Dr., South Bend, Ind. 46614

[21] Appl. No.: 432,075

[22] Filed: Sep. 30, 1982

[51] Int. Cl.³ .............................................. H04H 5/00
[52] U.S. Cl. .......................................... 381/2; 381/4; 455/280
[58] Field of Search .......................... 381/2, 3, 4, 8, 10, 381/12, 13; 455/132, 140, 141, 280, 334; 329/50, 146, 147

[56] References Cited

U.S. PATENT DOCUMENTS

| | | | |
|---|---|---|---|
| 3,842,211 | 10/1974 | Metro | 381/4 |
| 4,093,824 | 6/1978 | Grosjean | 381/4 |
| 4,131,851 | 12/1978 | Martiny et al. | 381/2 |
| 4,224,471 | 9/1980 | Ogita | 455/280 X |

Primary Examiner—R. J. Hickey
Attorney, Agent, or Firm—James D. Hall

[57] ABSTRACT

An FM broadcast band demodulator and stereo decoder which can be connected to an existing frequency modulated, or FM broadcast tuner or receiver. The unit includes four basic sections; FM demodulation, stereo decoding, audio amplification, and tuning error detection. The FM demodulation is done by an integrated circuit directly coupled to a second integrated circuit which performs the stereo decoding function. The function output signals of the second integrated circuit are re-centered to a direct current or d-c level of zero by voltage dividers and amplified by operational amplifiers to drive a load. The tuning error indicator is connected between the first and second integrated circuits and nullifies the d-c components from the output signal of the first integrated circuit before integrating the output signal to remove the audio portion and leave only an average d-c component. The remaining d-c signal is amplified and applied through a bridge rectifier to a light emitting diode or LED. The LED is lighted upon an imbalance of ±0.05 volt in the output signal of the unit.

6 Claims, 1 Drawing Figure

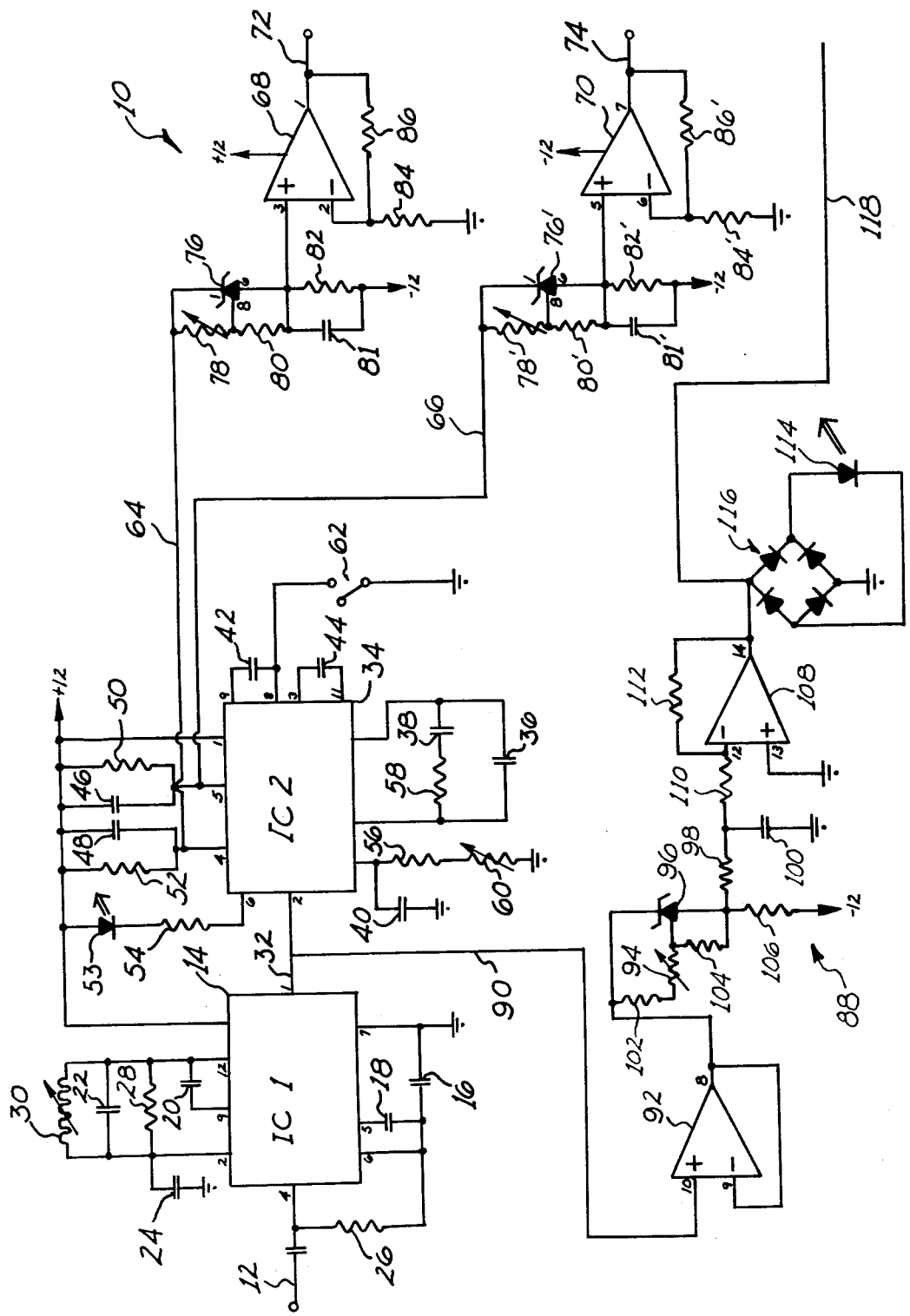

FM BROADCAST BAND DEMODULATOR/STEREO DECODER

SUMMARY OF THE INVENTION

This invention relates to an FM broadcast band demodulator and stereo decoder which has application as an attachment to an existing FM broadcast tuner/receiver.

The demodulator and decoder of this invention may be used in a tuner-demodulator unit or to convert a conventional stereo tuner to a unit having the characteristics, such as better sound quality and clarity of low frequency response, of a stereo tuner which is of the direct-coupled type by a simple and easy procedure. The demodulator and decoder of this invention preferably uses a ±12 volt power supply and a signal source of 10.7 MHz intermediate frequency, or IF, that can supply 0.5 to 2 volts peak-to-peak (P-P) into a 50 ohm load. One signal source may be an unbypassed cathode resistor in the first intermediate frequency (IF) stage after the limiter in an existing stereo tuner that can supply at least 0.5 volts P-P into the desired load.

The demodulator and decoder of this invention includes a first integrated circuit which receives the input source signal and performs stereo demodulation providing an output signal of approximately 2.7 volts, or of the same voltage as the bias voltage of a second stereo decoding integrated circuit. This permits direct coupling of the first and second integrated circuits. The output of the stereo demodulating integrated circuit may contain an undesirable d-c component which may be eliminated by a voltage divider circuit before said output is passed to an audio amplification stage. The FM demodulator and stereo decoder also includes a tuning error detector circuit which is directly coupled to the output of the FM demodulating integrated circuit and actuates a light emitting diode, or LED, when the tuner which provides the source signal is slightly off station. The tuning error indicator circuit has a voltage divider which nullifies the d-c component of the output of the FM demodulator integrated circuit in the same manner as is done with the output signal of the stereo decoder integrated circuit before it is amplified. The signal is then integrated within the tuner error indicator to remove the audio and leave only the average d-c component. The resulting signal is amplified and applied to an LED through a bridge rectifier integrated circuit.

Accordingly, it is an object of this invention to provide a novel and useful FM demodulator and stereo decoder unit which may be used to convert an existing FM tuner to one having the characteristics of a tuner wherein the demodulating and decoding components are directly coupled.

Another object is to provide an FM demodulator and stereo decoder unit which improves the sound reproduction quality of an existing FM tuner or receiver unit.

Another object is to provide an FM demodulator and stereo decoder unit which improves the low frequency response of an existing FM tuner unit.

Another object is to provide an FM demodulator and stereo decoder which has incorporated therein a tuning error indicator.

Another object is to provide an FM demodulator and stereo decoder which may be aligned by using a simple and quick procedure and a minimum of equipment.

Other objects of this invention will become apparent upon a further reading of the specification.

BRIEF DESCRIPTION OF THE DRAWINGS

The preferred embodiment illustrated is not intended to be exhaustive or to limit the invention to the precise form disclosed. It is chosen and described in order to explain the principles of the invention and its application and practical use to thereby enable others skilled in the art to utilize the invention.

The FM demodulator and stereo decoder 10 of this invention is designed to be attachable to an existing FM tuner (not shown) for converting the existing tuner to one having the characteristics of a tuner wherein the components are directly coupled. The FM demodulator/stereo decoder 10 of this invention requires a source which provides a 10.7 MHz intermediate frequency (IF) input signal that can supply 0.5-2 volts peak-to-peak (P-P) into a 50 ohm load to the input lead 12 of the unit. The unit also preferably utilizes a well regulated source of ±12 volts. A preferred source of the input signal within an existing tuner is an unbypassed cathode resistor in the first IF stage after the limiter that can supply at least 0.5 volts P-P into the desired 50 ohm load. The FM demodulation is performed by a first integrated circuit (IC1) 14 into which input lead 12 is connected. Integrated circuit 14 is preferably a chip of the quadrature detector type manufactured by Sylvania and bearing identification number ECG 737. Capacitors 16, 18, 20, 22, 24 and resistors 26, 28 are preferably the manufacturer's suggested application for the selected integrated circuit 14. A variable transformer 30 is the only adjustable component of the circuitry of the integrated circuit 14 (IC1) so that circuit alignment is fast and easy.

The output of integrated circuit 14 is carried by lead 32 to a second stereo decoder integrated circuit 34 (IC2) as shown. Integrated circuit 34 is preferably a phase-locked-loop type stereo decoder chip manufactured by Sylvania and having an identification number of ECG 801. Integrated circuit 14 (IC1) can be directly coupled from its first terminal to the second terminal of integrated circuit 34 (IC2) as shown. The d-c output from integrated circuit 14 (IC1) may be 2.7 volts, or the same as the bias voltage on the input stage of integrated circuit 34 (IC2). The circuit associated with integrated circuit 34 (IC2) including capacitors 36, 38, 40, 42, 46, 48 and resistors 50, 52, 54, 56, 58 are preferably selected to conform to the manufacturer's suggested application. A voltage controlled oscillator frequency control resistor 60 preferably is the only adjustable component in the circuitry around integrated circuit 34 (IC2) thereby facilitating an easy alignment of the associated integrated circuits. A light emitting diode, or LED 53 is placed within the circuitry around integrated circuit 34 to indicate reception of a stereo signal. A 75 microsecond deemphasis is produced in the left channel containing resistor 52 and capacitor 48, and the same timed deemphasis is caused to occur in the right channel containing resistor 50 and capacitor 46. The bandwidth of the baseband information processed by integrated circuit 34 is preferably limited at these points to its final value of DC-15 KHz. Each integrated circuit 14, 34 is connected to a single-ended power supply. A stereo/mono switch 62 is associated with the circuitry of integrated circuit 34 to provide means for selecting the desired mode of listening. The output of integrated circuit 34 (IC2) is connected to the left channel amplifier 68 by lead 64 and to the right channel amplifier 70 by lead 66. Prior to amplification of the signal carried by leads 64, 66, the d-c component of the output signal of integrated circuit 34 (IC2) must be cancelled or nullified to prevent harm to other equipment that may be connected to left and right channel output leads 72, 74, and this is accomplished by variable voltage zener diodes 76, 76' and variable resistors 78, 78' which perform a voltage divider function in each channel when connected as illustrated. Resistors 80, 82, 84, 86 of the left channel and 80', 82', 84', 86' of the right channel, and capacitors 81, 81' are selected to provide the proper biasing for operational amplifiers 68, 70 which provide the final amplification of the signals in their respective channels.

The FM demodulator and stereo decoder 10 includes tuning error indicator circuitry 88 which is directly coupled to the output of integrated circuit 14 by a lead 90. Lead 90 is connected to the positive input terminal of an operational amplifier 92 and delivers an isolated wide band output from integrated circuit 14. After passing through operational amplifier 92 the signal has its normal d-c component nullified by variable voltage zener diode 96 and variable resistor 94 as described above for the right and left channel outputs. The signal is then integrated by resistor 98 and capacitor 100 to remove the audio portion and leave only the average d-c component. The resistors 102, 104, 106 provide the proper biasing of operational amplifier 92. The resulting signal is amplified by operational amplifier 108 and applied to a light emitting diode, or LED, 114 through a bridge rectifier 116 which insures proper polarity of the signal. Resistors 110, 112 provide the proper gain of operational amplifier 108. The d-c error voltage is also available for use as an automatic frequency control (AFC) voltage and is carried by lead 118. As the on-station tuning is vital to insure a zero d-c output at the left and right channels it is preferred that a d-c imbalance of ±0.05 volt in the unit's output will cause the tuning error indicator LED 114 to be lighted.

When connected to an existing tuner, the alignment of the FM demodulator and stereo decoder 10 can be accomplished with a minimum of equipment, by tuning the existing tuner to which the invention has been connected to a moderately strong station and adjusting the core of variable transformer 30 for a maximum signal output. Variable resistor 94 must be adjusted for an output of 0.00 volts d-c at the AFC signal lead 118. By connecting a frequency counter to a proper pin of integrated circuit 34, variable resistor 60 should be adjusted for a reading of 19.000 KHz. Each variable resistor 80, 80' should be adjusted for a 0.00 volts d-c output at left and right channel leads 72, 74 respectively.

It is to be understood that the invention is not to be limited by the terms of the above description but may be modified within the scope of the appended claims.

What I claim is:

1. An FM demodulator and stereo decoder for connection to a tuner, comprising a first integrated circuit demodulating means connected to a single ended power supply for receiving a signal from said existing tuner and producing an isolated wide band signal output, a second integrated circuit decoding means connected to a single ended power supply and directly coupled to said first integrated circuit demodulating means for receiving said isolated wide frequency band signal and producing a limited frequency width signal divided into a left and a right stereo channel, left and right channel leads connected to said second integrated circuit, means placed in each said left and right channel leads for shifting the d-c component from said limited frequency width signal, and amplifying means placed in said left and right channel leads for amplifying said limited frequecy width signal after said d-c component is removed therefrom, whereby a load may be driven.

2. The FM demodulator and stereo decoder of claim 1, wherein said means for removing said d-c component from said limited frequency width signal includes a voltage divider which recenters the limited frequency width signal about a d-c level of zero.

3. The FM demodulator and stereo decoder of claim 1, wherein said FM demodulator and stereo decoder includes a tuning error indicator means which is directly coupled to said first integrated circuit demodulating means for receiving said isolated wide band signal output and producing a signal having only an average d-c component, a light emitting diode (LED) connected to said tuning error indicator means, whereby said diode is lighted upon detection of a d-c imbalance in said first integrated circuit demodulating means isolated wide band output signal.

4. The FM demodulator and stereo decoder of claim 3, wherein said tuning error indicator includes voltage divider means for recentering said first integrated circuit demodulating means isolated wide band signal output around a d-c voltage of zero, a capacitor and a resistor connected in series to integrate said recentered isolated wide band signal and remove the audio portion of the recentered isolated wide band signal, and bridge rectifier means for providing a signal with a constant correct polarity to said diode.

5. The FM demodulator and stereo decoder of claim 2, wherein said voltage divider includes a variable resistor and a zener diode connected in parallel, said variable resistor being adjustable to produce a zero d-c voltage in said left and right channel leads.

6. The FM demodulator and stereo decoder of claim 4 wherein said voltage divider includes a variable resistor and a zener diode connected in parallel, said variable resistor being adjustable to produce a d-c voltage component having a zero value in said tuner error indicator.

* * * * *